US012374591B2

(12) United States Patent
Sugiyama

(10) Patent No.: US 12,374,591 B2
(45) Date of Patent: Jul. 29, 2025

(54) SEMICONDUCTOR MODULE CASE AND METHOD FOR PRODUCING SEMICONDUCTOR MODULE CASE

(71) Applicant: FUJI ELECTRIC CO., LTD., Kawasaki (JP)

(72) Inventor: Takanori Sugiyama, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 485 days.

(21) Appl. No.: 17/830,210

(22) Filed: Jun. 1, 2022

(65) Prior Publication Data
US 2022/0293479 A1    Sep. 15, 2022

Related U.S. Application Data

(63) Continuation of application No. PCT/JP2021/016399, filed on Apr. 23, 2021.

(30) Foreign Application Priority Data

Jun. 29, 2020 (JP) .................. 2020-111131

(51) Int. Cl.
*H01L 23/053* (2006.01)
*B29C 45/00* (2006.01)
(Continued)

(52) U.S. Cl.
CPC ........ *H01L 23/053* (2013.01); *B29C 45/0025* (2013.01); *H01L 23/49811* (2013.01);
(Continued)

(58) Field of Classification Search
CPC ..................... H01L 23/053; B29C 2045/0027
See application file for complete search history.

(56) References Cited

U.S. PATENT DOCUMENTS

| 5,409,362 A | 4/1995 | Neu |
| 2006/0060982 A1 | 3/2006 | Ikawa et al. |

(Continued)

FOREIGN PATENT DOCUMENTS

| JP | H03290217 A | 12/1991 |
| JP | H04267115 A | 9/1992 |

(Continued)

OTHER PUBLICATIONS

European Search Report in the counterpart European application No. 21832648.6 dated Nov. 22, 2022.

(Continued)

*Primary Examiner* — Grant S Withers
(74) *Attorney, Agent, or Firm* — Rabin & Berdo, P.C.

(57) ABSTRACT

A semiconductor module case formed by injection molding into a box shape using a mold open on a bottom thereof, includes an external terminal disposed on a top face or a side face of the case, the external terminal penetrating through the case from an inside to an outside thereof and being electrically connectable to a semiconductor element inside of the case, and a single first gate for a resin to enter the case. The case has a rectangular shape in a plan view of the case and has first and second short sides and first and second long sides, and the first gate is disposed at a side face of the first short side and has a flat surface area having a first width that extends along the first short side in a width direction of the case.

12 Claims, 7 Drawing Sheets

(51) Int. Cl.
    *H01L 23/498*     (2006.01)
    *H01L 25/07*     (2006.01)
    *H01L 25/18*     (2023.01)
    *B29K 77/00*     (2006.01)
    *B29L 31/34*     (2006.01)
    *H01L 23/08*     (2006.01)

(52) U.S. Cl.
    CPC ............ H01L 25/072 (2013.01); H01L 25/18 (2013.01); *B29C 2045/0027* (2013.01); *B29K 2077/00* (2013.01); *B29L 2031/34* (2013.01); *H01L 23/08* (2013.01)

(56) References Cited

U.S. PATENT DOCUMENTS

| | | | |
|---|---|---|---|
| 2006/0186534 A1 | 8/2006 | Maeda et al. | |
| 2014/0346659 A1 | 11/2014 | Nakamura et al. | |
| 2015/0037525 A1* | 2/2015 | Maeda ................ | B29C 66/8181 264/478 |
| 2018/0277397 A1 | 9/2018 | Hashizume et al. | |
| 2019/0161608 A1 | 5/2019 | Komori | |

FOREIGN PATENT DOCUMENTS

| | | |
|---|---|---|
| JP | H05293846 A | 11/1993 |
| JP | H08197564 A | 8/1996 |
| JP | 2001054920 A | 2/2001 |
| JP | 2005319708 A | 11/2005 |
| JP | 2006093255 A | 4/2006 |
| JP | 2006256311 A | 9/2006 |
| JP | 2007069602 A | 3/2007 |
| JP | 2014171440 A | 9/2014 |
| JP | 2017094589 A | 6/2017 |
| WO | 2013145619 A1 | 10/2013 |

OTHER PUBLICATIONS

International Search Report for PCT/JP2021/016399, mailed on Jul. 20, 2021.

* cited by examiner

SEMICONDUCTOR MODULE CASE AND METHOD FOR PRODUCING SEMICONDUCTOR MODULE CASE

CROSS REFERENCE TO RELATED APPLICATIONS

This is a continuation application of International Application PCT/JP2021/016399 filed on Apr. 23, 2021 which claims priority from a Japanese Patent Application No. 2020-111131 filed on Jun. 29, 2020, the contents of which are incorporated herein by reference.

TECHNICAL FIELD

The present invention relates to a semiconductor module case and a method for producing a semiconductor module case.

BACKGROUND ART

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters.

In semiconductor modules of this type, semiconductor elements disposed on a predetermined substrate are housed in a resin case for example. Injection molding technology for example is used in mass production of the case used in a semiconductor module. In injection molding, a hot molten resin is injected into a mold, and a desired molded product is created through steps such as pressurizing, cooling, and solidifying (for example, refer to Patent Literature 1-4).

CITATION LIST

Patent Literature

Patent Literature 1: Japanese Patent Laid-Open No. 4-267115
Patent Literature 2: Japanese Patent Laid-Open No. 8-197564
Patent Literature 3: Japanese Patent Laid-Open No. 2001-54920
Patent Literature 4: Japanese Patent Laid-Open No. 2014-171440

SUMMARY OF INVENTION

Technical Problem

By the way, in high-capacity semiconductor modules, the increased size of the case makes it necessary to supply more resin in a short time during molding. For example, if there is too little resin shot into the mold by injection in a short time, there is a possibility that the molded product will not be thick enough, and defects may occur. Moreover, it is also conceivable to increase the injection speed to secure the fill rate of the resin. However, a resin injection speed that is too fast may cause air to be introduced into the mold and create resin voids. In this way, changing the conditions for injection molding associated with larger case sizes may be subject to various constraints.

An object of the present invention, which has been made in light of this point, is to provide a semiconductor module case and a method for producing a semiconductor module case that can supply a sufficient amount of resin into a mold even in a short time to obtain an excellent molded product.

Solution to Problem

A semiconductor module case according to an aspect of the present invention houses semiconductor elements and is formed by injection molding into a box shape open on the bottom, the case having a rectangular shape in a plan view with external terminals disposed on a top face or a side face of the case, the external terminals being electrically connected to the semiconductor elements on the inside of the case and penetrating through the inside to the outside of the case, the case being provided with a single first gate that is an entrance for a resin in a side face corresponding to a short side of the rectangular shape, wherein the first gate has a flat shape that is long in a width direction of the case.

A method for producing the above semiconductor module case according to an aspect of the present invention includes filling a mold with a resin through the first gate, and removing a resin channel portion connected to the case, wherein the resin channel portion includes a runner that forms a channel for the resin connected to the first gate, and the runner has a film shape that is long in the width direction of the case, and is inclined such that the thickness decreases toward the first gate.

Advantageous Effects of Invention

According to the present invention, it is possible to supply a sufficient amount of resin into a mold even in a short time to obtain an excellent molded product.

DESCRIPTION OF EMBODIMENTS

Figure 1:
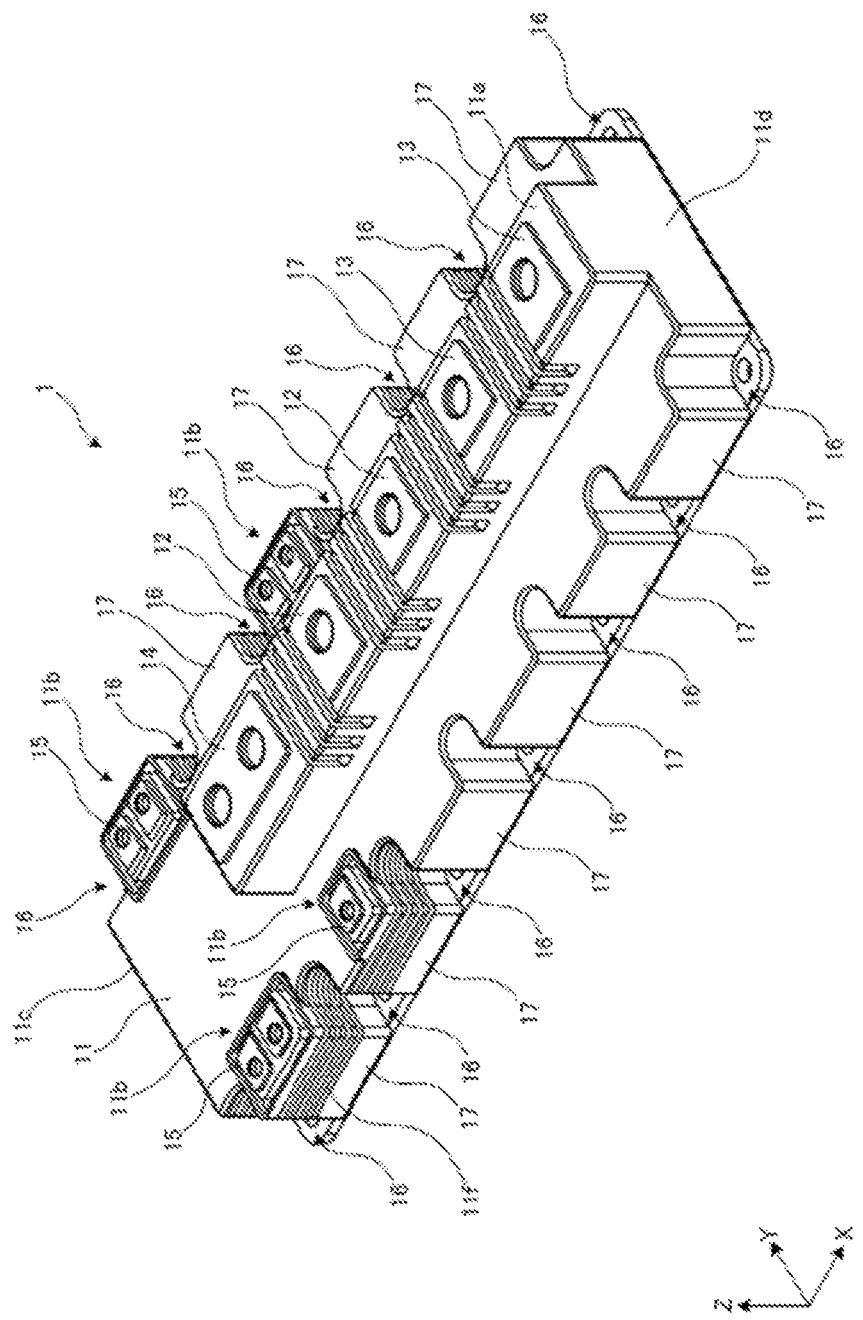
FIG. 1 is a perspective view of a semiconductor module according to an embodiment.
Figure 2:
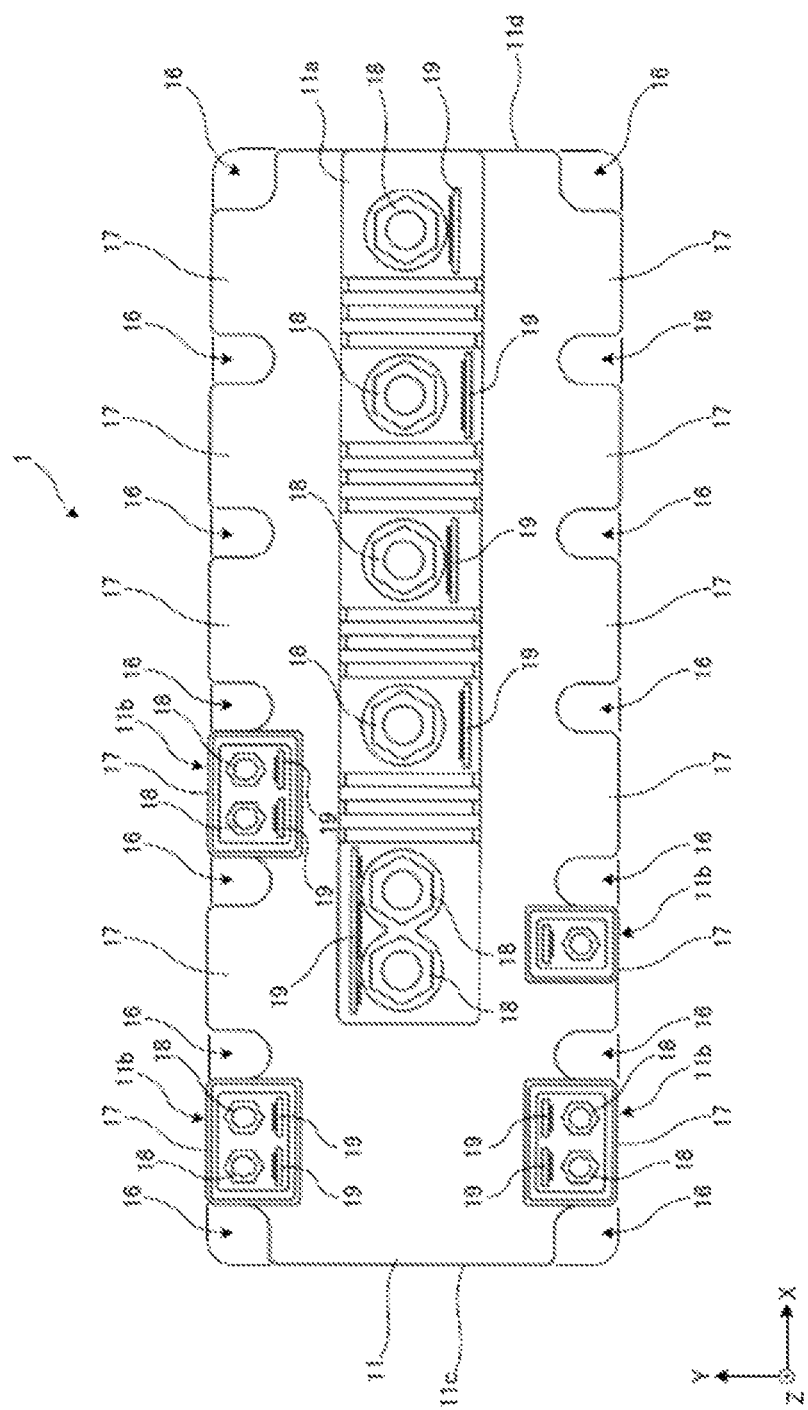
FIG. 2 is a plan view of a semiconductor module according to the embodiment.
Figure 3:
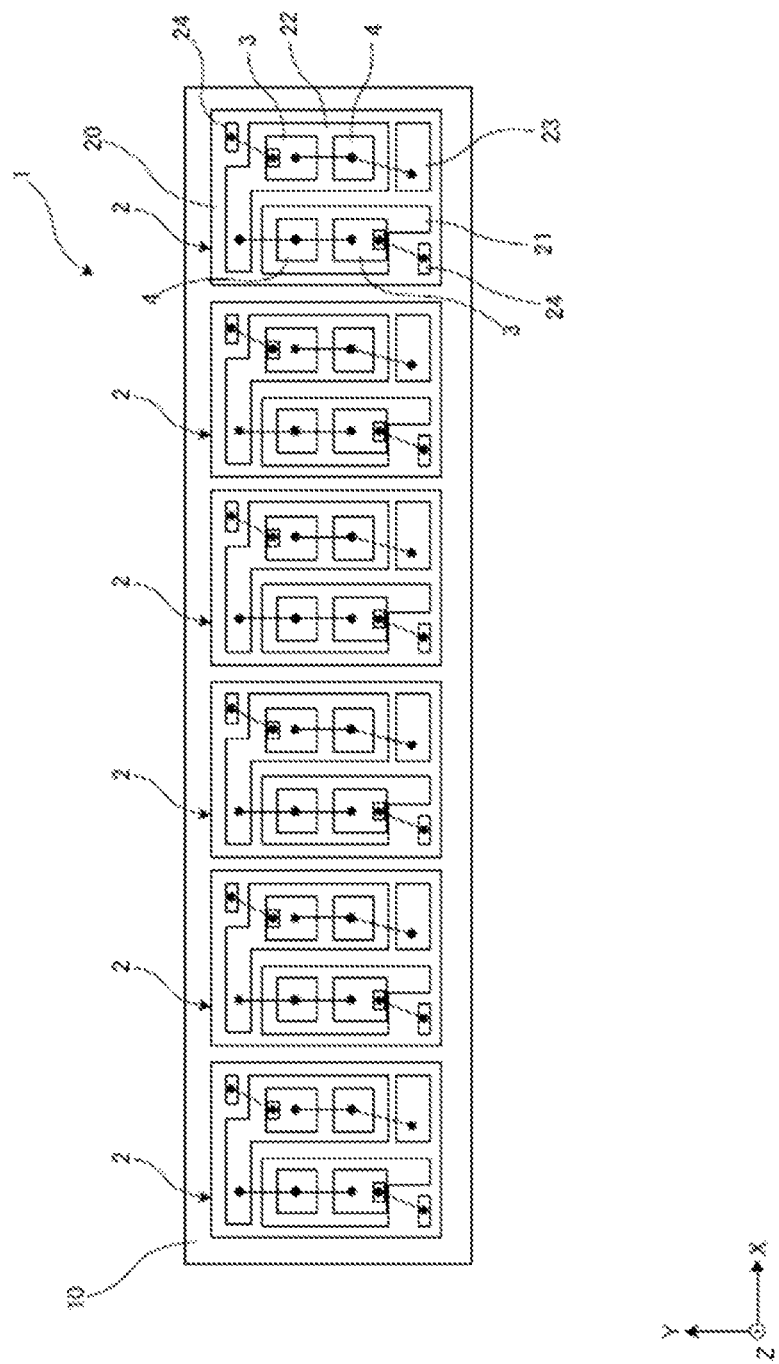
FIG. 3 is a plan view with the case removed from the semiconductor module illustrated in FIG. 2.

Hereinafter, a semiconductor module to which the present invention can be applied will be described. FIG. 1 is a perspective view of a semiconductor module according to the embodiment. FIG. 2 is a plan view of the semiconductor module according to the embodiment. FIG. 3 is a plan view with the case removed from the semiconductor module illustrated in FIG. 2. In FIGS. 2 and 3, main terminals and control terminals are omitted for convenience. Note that the semiconductor module illustrated below is merely one non-limiting example, and may be modified appropriately.

Also, in the following diagrams, the longitudinal direction of the semiconductor module (the direction in which a plurality of multilayer substrates are arranged) is designated the X direction, the short direction of the semiconductor module is designated the Y direction, and the height direction (the substrate thickness direction) is designated the Z direction. The illustrated X, Y, and Z axes are orthogonal to each other and constitute a right-handed coordinate system. Additionally, in some cases, the X direction may be referred to as the left-right direction, the Y direction as the front-back direction, and the Z direction as the up-down direction. These directions (front-back, left-right, and up-down directions) are terms used for convenience in the description, and depending on the installed attitude of the semiconductor module, the correspondence relationships between these directions and the XYZ directions may change. For example, the surface on the heat-dissipating side (cooler side) of the semiconductor module is referred to as the bottom face, while the opposite side is referred to as the top face. Also, in this specification, a plan view means the case of viewing the top face of the semiconductor module from the positive Z direction. Also, in this specification, directional and angular notations may be rough directions and angle, and values within ±10 degrees may be tolerated.

The semiconductor module according to the embodiment is applied to a power conversion device such as a power module, for example, and is a power module that forms an inverter circuit. As illustrated in FIGS. 1-3, the semiconductor module 1 includes a base plate 10, a plurality of multilayer substrates 2 disposed on top of the base plate 10, a plurality of semiconductor elements 3, 4 disposed on top of the multilayer substrates 2, a case 11 that houses the multilayer substrate 2 and the plurality of semiconductor elements, and an encapsulating resin (not illustrated) that fills the case 11.

The base plate 10 is a rectangular plate having a top face and a bottom face. The base plate 10 functions as a heatsink. Additionally, the base plate 10 has a rectangular shape in a plan view having a long side in the X direction and a short side in the Y direction. The base plate 10 is a metal plate containing copper, aluminum, or an alloy thereof, for example. The surface of the base plate 10 may also be plated.

The case 11 having a rectangular shape in a plan view is disposed on the top face of the base plate 10. The case 11 is formed into a cuboid box shape open on the bottom, with a frame part that forms side walls and a lid part that covers the top. The case 11 covers the top of the base plate 10 and demarcates a space that houses the multilayer substrates 2, the semiconductor elements, the encapsulating resin, and the like.

In addition, the case 11 is provided with external terminals. Specifically, the external terminals include a positive electrode terminal 12 (P terminal), a negative electrode terminal 13 (N terminal), and an output terminal 14 (M terminal). The positive electrode terminal 12, the negative electrode terminal 13, and the output terminal 14 may also be referred to as main terminals. Furthermore, a plurality of control terminals 15 may be included among the external terminals. One end of each external terminal is connected to a predetermined circuit board inside the case 11. The external terminals penetrate the case 11, with one end disposed on the inside of the case 11 and the other end exposed externally (on the outside) from the top face of the case 11. The other ends of the external terminals can be electrically connected to external equipment. The other ends of the plurality of main terminals (positive electrode terminal 12, negative electrode terminal 13, output terminal 14) are arranged in the longitudinal direction, that is, the X direction. The other ends of the plurality of main terminals are disposed off-center on the positive X side and centered in the Y direction on the top face of the case 11. The other ends of the plurality of control terminals 15 are arranged in the longitudinal direction, that is, the X direction. The other ends of the plurality of control terminals 15 are disposed off-center on the negative X side and at the edges in the Y direction on the top face of the case 11.

Specifically, a terminal placement part 11a, in which the main terminals are disposed, and terminal placement parts 11b, in which the control terminals 15 are disposed, are formed on the top face of the case 11. The terminal placement part 11a projects out in the Z direction from the top face of the case 11, and has a cuboid shape that is long in the X direction. The terminal placement part 11a is disposed off-center on the positive X side and centered in the Y direction on the top face of the case 11.

The terminal placement parts 11b are disposed on the top face of protruding parts 17 described next. The terminal placement parts 11b do not have to project out in the Z direction from the top face of the case 11. The terminal placement parts 11b are disposed off-center on the negative X side and at the edges in the Y direction on the top face of the case 11.

Also, a plurality of counterbores 16 for securing the module are formed on the pair of long sides (outer surfaces) of the case 11 that face opposite in the Y direction. The plurality of counterbores 16 are arranged in the X direction with seven disposed on each side, for example. The plurality of counterbores 16 causes a plurality of protruding parts 17 to be formed on the side faces of the case 11 that face opposite in the Y direction. Among the plurality of protruding parts 17, predetermined protruding parts 17 positioned on the negative X side form the terminal placement parts 11b. In other words, the terminal placement parts 11b are disposed off-center on the negative X side.

Also, a plurality of grooves 11f running in the X direction are formed on the pair of long sides (outer surfaces) of the case 11 that face opposite in the Y direction. The grooves 11f are formed on the outward surfaces of the predetermined protruding parts 17 and counterbores 16 where the terminal placement parts lib are disposed. In other words, the grooves 11f are disposed off-center on the negative X side.

Also, side faces 11c and 11d having a flat YZ plane are formed on the pair of short sides (outer surfaces) of the case 11 that face opposite in the X direction. Respective counterbores 16 may also be formed at the two edges in the Y direction. In other words, the side faces 11c and 11d having a flat YZ plane are formed in the center on the short sides.

As illustrated in FIG. 2, a housing 18 for a nut that secures an external conductor with a screw (neither the nut nor the screw are illustrated) is formed on the top face of the terminal placement parts 11a and 11b. For example, six housings 18 are formed and arranged in the X direction. The housing 18 has a regular hexagonal shape in a plan view corresponding to the shape of the nut. Additionally, a slit 19 for terminal insertion is formed in the side of the housing 18. The slit 19 penetrates the top face of the case in the thickness direction (Z direction) as a long stripe in the X direction. Also, the housing 18 and the slit 19 formed in the terminal placement parts 11b are smaller than the housing 18 and the slit 19 formed in the terminal placement part 11a.

As illustrated in FIG. 1, on the top face of the terminal placement part 11a, the positive electrode terminal 12, the negative electrode terminal 13, and the output terminal 14 are arranged in the above order from the negative X side. Also, the control terminals 15 are disposed on the top face of the terminal placement parts 11b. One end of each terminal is inserted into the slit 19 and bonded to the multilayer substrates 2 inside the case 11. The other end of each terminal is bent at a right angle to cover the top of the housing 18. In the center of each bent terminal, an opening is formed in correspondence with the housing 18. The opening penetrates through the thickness direction (Z direction) of the terminal. Each external terminal is formed by a process such as press working a metal plate such as a copper material, a copper alloy material, an aluminum alloy material, or an iron alloy material.

Also, as illustrated in FIG. 3, on the inner side of the case 11, six multilayer substrates 2 are disposed on the top face of the base plate 10. The multilayer substrates 2 are formed into a rectangular shape in a plan view, for example. The six multilayer substrates 2 are arranged in the X direction. The multilayer substrates 2 are formed by stacking metal layers and insulating layers, and include a direct copper bonding (DCB) substrate, an active metal brazing (AMB) substrate, or a metal base substrate, for example. Specifically, the multilayer substrates 2 include an insulating plate 20, a heatsink (not illustrated) disposed on the bottom face of the insulating plate 20, and circuit boards 21, 22, 23 disposed on the top face of the insulating plate 20.

The insulating plate 20 has a predetermined thickness in the Z direction, and is formed into a tabular shape having a top face and a bottom face. The insulating plate 20 is formed by a ceramic material such as alumina ($Al_2O_3$), aluminum nitride (AlN), or silicon nitride ($Si_3N_4$), a resin material such as epoxy, or an insulating material such as an epoxy resin using a ceramic material as a filler, for example. Note that the insulating plate 20 may also be referred to as an insulating layer or an insulating film.

The heatsink has a predetermined thickness in the Z direction, and is formed so as to cover substantially the entire bottom face of the insulating plate. The heatsink is formed by a metal plate with favorable thermal conductivity, such as copper or aluminum, for example.

On the top face (main surface) of the insulating plate 20, the three circuit boards 21, 22, 23 are formed as independent islands that are electrically insulated from each other. Also, besides the three circuit boards 21, 22, 23, two circuit boards 24 are disposed as circuit boards for control. The two circuit boards 24 are provided in a pair of diagonally opposite corners of the insulating plate 20. These circuit boards contain a metal layer of predetermined thickness formed by copper foil or the like.

The end parts of the external terminals described above are connected to the top faces of these circuit boards. The respective end parts of these external terminals are connected to the top face of a predetermined circuit board, either directly by ultrasonic welding, laser welding, or the like, or through a bonding material such as solder or sintered metal. With this configuration, the respective end parts of the external terminals are conductively connected to predetermined circuit boards. For convenience, the connection relationships between the external terminals and the circuit boards are omitted from the description.

The plurality of semiconductor elements 3, 4 are disposed on the top face of the circuit boards 21, 22 through a bonding material such as solder. With this configuration, respective bottom electrodes of the semiconductor elements 3, 4 are conductively connected to the circuit boards 21, 22. Accordingly, the external terminals and the semiconductor elements are conductively connected.

The semiconductor elements 3, 4 are formed having a square shape in a plan view by a semiconductor substrate such as silicon (Si), silicon carbide (SiC), or gallium nitride (GaN), for example. Note that a switching element such as an insulated-gate bipolar transistor (IGBT) or a power metal-oxide-semiconductor field-effect transistor (power MOSFET), or a diode such as a free-wheeling diode (FWD), is used as each of the semiconductor elements 3, 4. Hereinafter, in the embodiment, one semiconductor element 3 is designated an IGBT element while the other semiconductor element 4 is designated a diode element. Also, an element such as a reverse-conducting IGBT (RC-IGBT) element that combines an IGBT and an FWD in one, a power MOSFET element, or a reverse-blocking IGBT (RB-IGBT) having a sufficient withstand voltage with respect to a reverse bias may also be used as each of the semiconductor elements. Also, properties such as the shape, number, and placement of the semiconductor elements may be changed appropriately. Note that the semiconductor elements according to the embodiment are vertical switching elements in which a functional element such as a transistor is formed on a semiconductor substrate.

In this embodiment, one of each of the semiconductor elements 3, 4 are arranged in the Y direction on the top face of the circuit board 21. On the circuit board 21, the semiconductor element 3 is positioned on the positive Y side and the semiconductor element 4 is positioned on the negative Y side. Similarly, on the top face of the circuit board 22, one of each of the semiconductor elements 3, 4 are arranged in the Y direction. On the circuit board 22, the semiconductor element 4 is positioned on the positive Y side and the semiconductor element 3 is positioned on the negative Y side. In this embodiment, the semiconductor elements 3, 4 on the circuit board 21 form an upper arm, while the semiconductor elements 3, 4 on the circuit board 22 form a lower arm.

In addition, the semiconductor elements 3, 4 arranged in the Y direction are electrically connected by a wiring member. The semiconductor element 4 and a predetermined circuit board are also electrically connected by a wiring member. Furthermore, a gate electrode of the semiconductor element 3 and the circuit board 24 are also electrically connected by a wiring member.

Conductor wires (bonding wires) are used as these wiring members. Gold, copper, aluminum, gold alloy, copper alloy, and aluminum alloy can be used either singly or in combination with each other as the material of the conductor wires. Additionally, it is also possible to use member other than conductor wires as the wiring members. For example, ribbons can be used as the wiring members. Furthermore, the wiring members are not limited to wires or the like, and may also be formed by a metal plate such as a copper material, a copper alloy material, an aluminum alloy material, or an iron alloy material, for example.

By the way, injection molding technology is used in mass production of the case (which may also be referred to as the terminal case) of the semiconductor module as described above. With this type of injection molding, a finished product is formed according to the following steps, for example.

(1) Resin pellets, which are the raw material of the case, are supplied into a cylinder of a molding machine.
(2) By heating the resin inside the cylinder, the resin plasticizes (becomes molten).
(3) A screw inside the cylinder is made to rotate, thereby injecting the resin into a mold in a high-temperature and high-pressure state.
(4) The resin is pressurized, cooled, and solidified inside the mold, and after that, the mold is opened and the molded product is removed by ejector pins or the like.
(5) Unwanted portions of the molded product (such as a resin channel portion) are cut to obtain the finished product.

Moreover, in high-capacity semiconductor modules, the increased size of the case makes it necessary to supply more resin in a short time during molding. If the molding time is increased, the increase in the takt time leads to rising costs, and furthermore, as the temperature of the molten resin falls, liquidity worsens and may also lead to molding defects. In other words, to mass-produce molded products at low cost and with good quality, it is necessary to keep the molding time short.

To shorten the takt time, it is conceivable to shorten the resin injection time, for example. However, as a result of too little resin shot into the mold, there is a possibility that the molded product will not be thick enough, and defects may occur. Moreover, it is also conceivable to increase the injection speed to secure the fill rate of the resin. However, a resin injection speed that is too fast may cause air to be introduced into the mold and create resin voids. Also, if the holding time (pressurizing time) of the mold is too short, there is a possibility that the resin may recede without solidifying adequately and create sink marks or the like. In this way, changing the conditions for injection molding associated with larger case sizes may be subject to various constraints.

Accordingly, the inventor focused on the shape of the gate that is the entrance for resin into the case mold, and conceived of the present invention. Here, FIGS. 4A to 6B will be referenced to describe a semiconductor module case and a method for producing the case according to the present embodiment in detail.

Figure 4A:
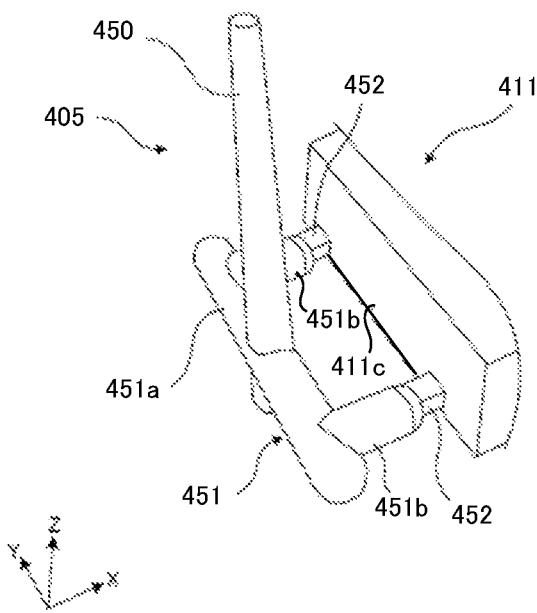
FIGS. 4A and 4B are perspective views of the area around a gate of a case according to a reference example.
Figure 4B:
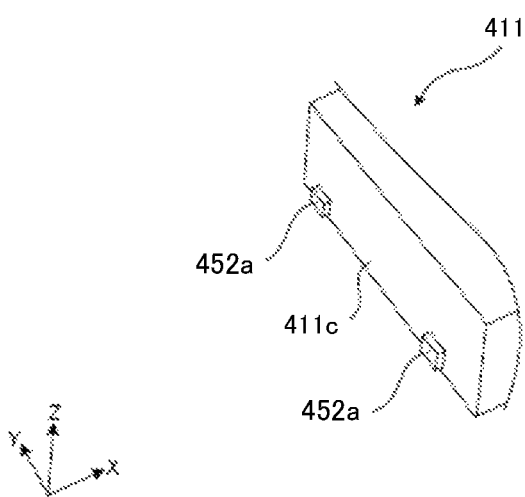
Figure 5A:
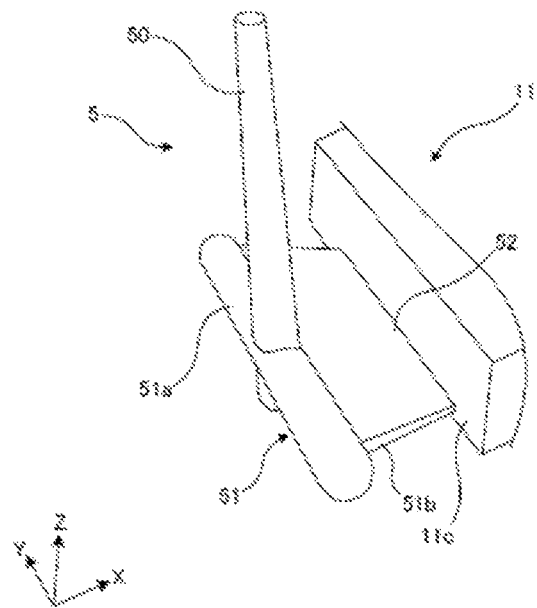
FIGS. 5A and 5B are perspective views of the area around a gate of a case according to the embodiment.
Figure 5B:
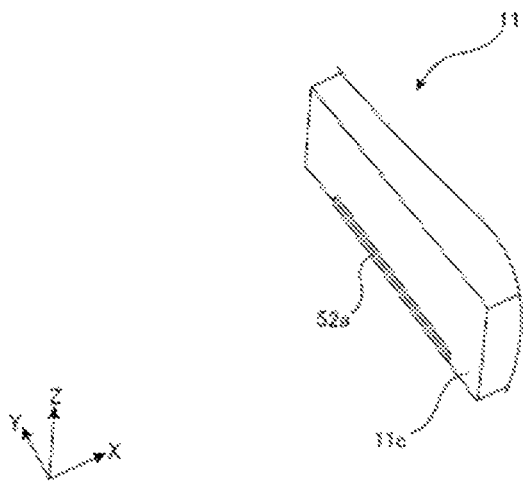
Figure 6A:
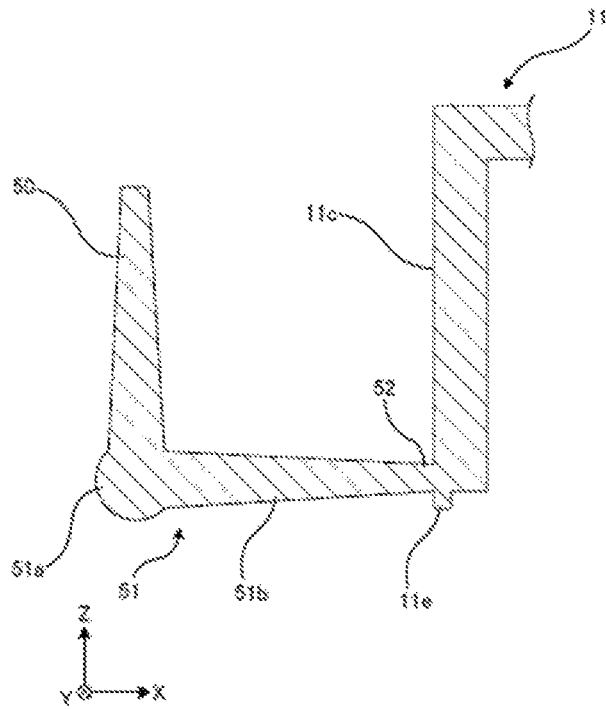
FIGS. 6A and 6B are cross sectional views of the area around the gate of the case according to the embodiment.
Figure 6B:
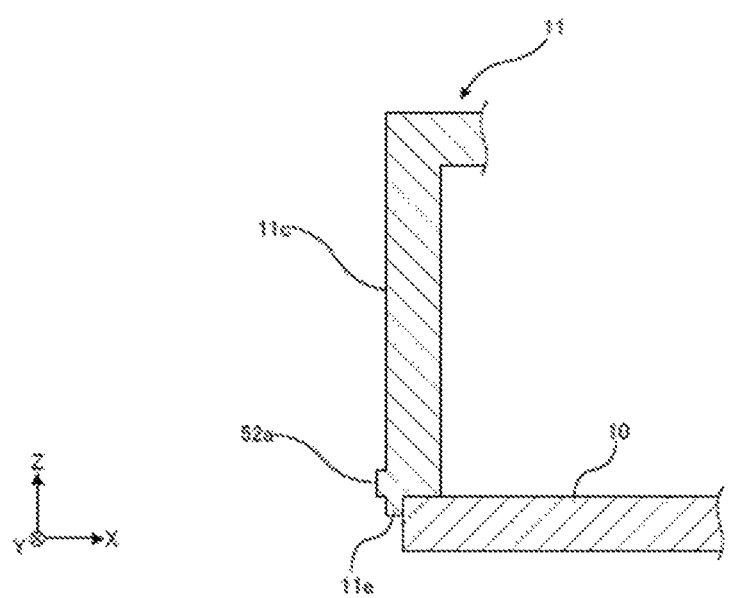

FIGS. 4A and 4B are perspective views of the area around a gate of a case according to a reference example. FIGS. 5A and 5B are perspective views of the area around a gate of a case according to the embodiment. FIGS. 6A and 6B are cross sectional views of the area around the gate of the case according to the embodiment. FIGS. 4A, 5A, and 6A illustrate the state immediately after removing the molded product from the mold. FIGS. 4B, 5B, and 6B illustrate the state after cutting the unwanted portion (resin channel portion) from the molded product.

As illustrated in FIG. 4A, in the molded product according to the reference example, the resin passage from the injection molding machine to the mold (neither of which is illustrated) remains as an unwanted portion (resin channel portion 405). Specifically, the resin channel portion 405 is configured to include a sprue 450 connected to the injection molding machine, a runner 451 connected to the sprue 450, and a pair of gates 452 joined to the runner 451 and the case 411.

The sprue 450 is a passage for delivering resin from the nozzle of the injection molding machine to the runner 451. Specifically, the sprue 450 has a cylindrical shape extending in the Z direction. The sprue 450 is also tapered such that the diameter gradually widens from top to bottom. The bottom end of the sprue 450 penetrates the runner 451.

The runner 451 is a passage that guides resin from the sprue 450 into the mold (cavity). Specifically, the runner 451 includes a first runner 451a and a pair of second runners 451b. The first runner 451a has a cylindrical shape extending to either side in the Y direction from the bottom end of the sprue 450. The first runner 451a has a length corresponding to the width of the case 411 in the Y direction. The pair of second runners 451b have a cylindrical shape respectively extending in the positive X direction from either end of the first runner 451a. The second runners 451b extend toward the side face 411c of the case 411.

The gates 452 are passages that connect the runner 451 (second runners 451b) and the mold, and form entrances into the mold for the resin. Specifically, the gates 452 have a rectangular pillar shape extending from the top of each second runner 451b toward the side face 411c of the case 411. Also, the gates 452 have a rectangular cross section that is smaller in diameter than the second runners 451b. For example, the cross-sectional area of a single gate 452 is 3 mm×5 mm=15 mm$^2$.

In the reference example illustrated in FIGS. 4A and 4B, as described above, two gates 452 with a relatively small cross-sectional area are provided. For this reason, if the case is relatively large, there is a possibility that the mold may not be filled with a sufficient amount of resin when injecting the resin into the mold. Also, since there are a plurality of gates 452, there exists a portion inside the mold where the flows of resin respectively coming in from the gates 452 converge. This resin convergence portion may later become a location that affects the strength of the case.

Also, as illustrated in FIG. 4B, the cross section 452a of the gates 452 after the removal of the resin channel portion 405 has burrs, that is, the remaining portions of the gates 452, that project out by a predetermined height from the side face 411c of the case 411. The height of the burrs is from 0.5 mm to 2.0 mm, for example. In a later assembly step, there is a possibility that the burrs may interfere with a special-purpose jig and cause component mounting defects, and therefore the burrs are preferably as small as possible. In particular, a lower projecting height of the burrs is preferable.

To address the above issue, in the configuration of the present application illustrated in FIGS. 5A and 5B, the runner 51 forming a part of the resin passage is film-shaped. Specifically, as illustrated in FIG. 5A, the resin channel portion 5 is configured to include a sprue 50 connected to the injection molding machine, a runner 51 connected to the sprue 50, and a gate 52 (first gate) joined to the runner 51 and the case 11. Note that the sprue 50 has the same configuration as in FIGS. 4A and 4B, and therefore a description is omitted.

The runner 51 is a passage that guides resin from the sprue 50 into the mold (cavity). Specifically, the runner 51 includes a first runner 51a and a second runner 51b. The first runner 51a has a cylindrical shape extending to either side in the Y direction from the bottom end of the sprue 50. The first runner 51a has a length corresponding to the width of the case 11 in the Y direction.

The second runner 51b extends in a film shape in the positive X direction from the side face of the first runner 51a toward the side face 11c of the case 11. The second runner 51b is long in the width direction (Y direction) of the case 11, and has thickness in the Z direction. Also, the second runner 51b has a tapered shape inclined such that the thickness decreases in the positive X direction (toward the gate 52 described later). The angle of inclination is approximately 15 degrees, for example.

The gate 52 is a passage that connects the runner 51 (second runner 51b) and the mold, and forms an entrance into the mold for the resin. The gate 52 has a flat shape that is long in the width direction (Y direction) of the case 11. For example, as illustrated in FIG. 5B, the area of the cross section 52a of the gate 52 is 1 mm (thickness in the Z direction)×40 mm (width (first width) in the Y direction)=40 mm$^2$.

As illustrated in FIG. 5B, the case 11 after the removal of the resin channel portion 5 is provided with the cross section 52a of the single gate 52 in the side face 11c of the case 11. The gate 52 after the removal of the resin channel portion 5 may be a portion of high surface roughness on the side face 11c of the case 11. Also, the gate 52 after the removal of the resin channel portion 5 may have a burr, that is, the remaining portion of the gate 52, that projects out by a predetermined height from the side face 11c of the case 11. The height of the burr in this case is less than 0.5 mm, for example. Also, the gate 52 after the removal of the resin channel portion 5 may also have a recess that is sunken by a predetermined depth inward into the case from the side face 11c of the case 11. The depth of the recess in this case is less than 0.5 mm, for example.

In this way, the method of producing the case 11 according to the present application is configured to include a step of filling the mold with resin through the resin passage (sprue 50, runner 51, gate 52) described above (filling step), a step of pressurizing, cooling, and solidifying the resin inside the mold to form the case (molding step), a step of removing the molded product from the mold (removing step), and a step of removing unwanted portions (the resin channel portion 5 connected to the case) from the molded product (resin channel portion removal step).

As described above, the second runner 51b has a film shape that is long in the width direction of the case 11. Additionally, the gate 52 is connected to the second runner 51b and thereby has a flat shape that is long in the width direction of the case 11.

In the present embodiment, by adopting the gate 52 with a flat shape having a large cross-sectional area compared to the reference example, it is possible to fill the mold with a large amount of resin in a short time. In addition, by configuring the single gate 52 in the present embodiment, it is possible to reduce weld portions where flows of resin converge inside the mold compared to the reference example provided with a plurality of gates 52. As a result, it is possible to adequately ensure the strength of the molded product (case 11).

Also, in the case 11 according to the present application, the side faces 11c, 11d which are flat in the YZ plane corresponding to the short sides are formed. The side faces 11c, 11d face opposite in the X direction. The side faces 11c, 11d are also formed in the center on the short sides. Moreover, the single gate 52 is formed centered at the lower edge of the side face 11c having a flat YZ plane.

According to this configuration, the single gate 52 is disposed centered at the lower edge of the side face 11c on the short side of the case 11. Consequently, the resin can flow in uniformly and without bias, weld portions can be reduced, and a case with uniform characteristics can be produced. Furthermore, the gate 52 is formed on a flat surface. For this reason, the unwanted portions of the molded product can be removed easily.

Also, in the case 11 according to the present application, a plurality of grooves 11f running in the X direction are formed on the pair of long side faces. The grooves 11f are also formed on the predetermined protruding parts 17 and counterbores 16 where the terminal placement parts 11b are disposed.

According to this configuration, when the resin flows from the other end to the end (from the entrance to the exit) of the case 11, the flow of the resin is guided by the grooves 11f, thereby causing the resin to smoothly blanket the protruding parts 17 and the counterbores 16 on the side faces as well. Consequently, an excellent molded product can be obtained.

Additionally, in the case 11, the main terminals (positive electrode terminal 12, negative electrode terminal 13, and output terminal 14) are disposed near the end on the positive X side, and the control terminals 15 are disposed near the other end on the negative X side. The single gate 52 is provided on the side face 11c positioned on the other end of the case 11.

According to this configuration, the resin entrance is provided near the control terminals 15 where the case shape is relatively complex compared to the main terminal side. Since the resin has relatively high temperature and low viscosity near the entrance, arranging the complex shape of the case 11 near the entrance makes it possible to obtain an excellent molded product. Note that the main terminal side relatively far away from the entrance has a relatively simple shape, and therefore does not pose a problem for molding even if the resin temperature falls and the viscosity increases somewhat.

Also, the thickness (length in the Z direction) of the gate 52 is preferably 0.5 mm or greater and 2.5 mm or less. The thickness (length in the Z direction) of the gate 52 is preferably 1/100th or greater and 1/10th or less than the width (length in the Y direction) of the gate 52. In particular, the second runner 51b has a film shape that is long in the width direction of the case 11, and is inclined such that the thickness decreases toward the gate 52. The angle of inclination is preferably 10 degrees or greater and 30 degrees or less, for example. According to the above configuration, the base end side of the second runner 51b is thick compared to the gate 52 side, thereby increasing the rigidity on the base end side.

On the other hand, the thickness (length in the Z direction) of the gate 52 is small compared to the length (length in the Y direction), and moreover, the gate 52 is thin compared to the base end side of the second runner 51b. For this reason, the rigidity in the Z direction (shear rigidity) is reduced. As a result, by applying a force in the Z direction when removing the resin channel portion 5, the gate 52 can be cut easily at the starting point. In addition, the projection height (height from the side face 11c of the case 11) of the cross section 52a of the gate 52 can be reduced, making it possible to simplify the step for removing the gate 52 edge face.

Also, in the present embodiment, the resin forming the case 11 is a thermoplastic resin. Such a resin may be polyphenylene sulfide (PPS) resin, polybutylene terephthalate (PBT) resin, polybutylene succinate (PBS) resin, polyamide (PA) resin, acrylonitrile butadiene styrene (ABS), or the like. Moreover, a filler may also be added to the resin for the case 11. The filler is ceramics, for example. Such a filler may be silicon oxide, aluminum oxide, boron nitride, or aluminum nitride. In particular, the case 11 is preferably formed using a polyamide resin such as nylon 6 or nylon 66 containing some kind of filler.

If the resin injection speed is raised while the cross-sectional area of the gate(s) 52 is small, like in the reference example described above, the temperature around the gate 52 rises, and as a result, a phenomenon may occur in which gas is emitted from the resin and causes whitening on the molded product. In the present embodiment, securing the cross-sectional area of the gate 52 makes it possible to reduce such whitening of the resin.

Also, in the present embodiment, as illustrated in FIG. 6A, the gate 52 is provided at the lower edge of the case 11. By positioning the gate 52 at the edge of the case 11, the formation of cracks in the case 11 that start from the gate 52 can be prevented.

Additionally, a protruding part 11e that projects downward is provided at the lower edge of the case 11. The protruding part 11e is formed in a rectangular frame shape running along the outline of the case 11. The gate 52 is formed above the protruding part 11e. More specifically, the bottom face of the gate 52 is flush with the base end of the protruding part 11e (bottom face of the case 11). The protruding part 11e has a shape that follows the outline of the base plate 10, and functions as a projection for positioning the case 11 with respect to the base plate 10.

Figure 7:
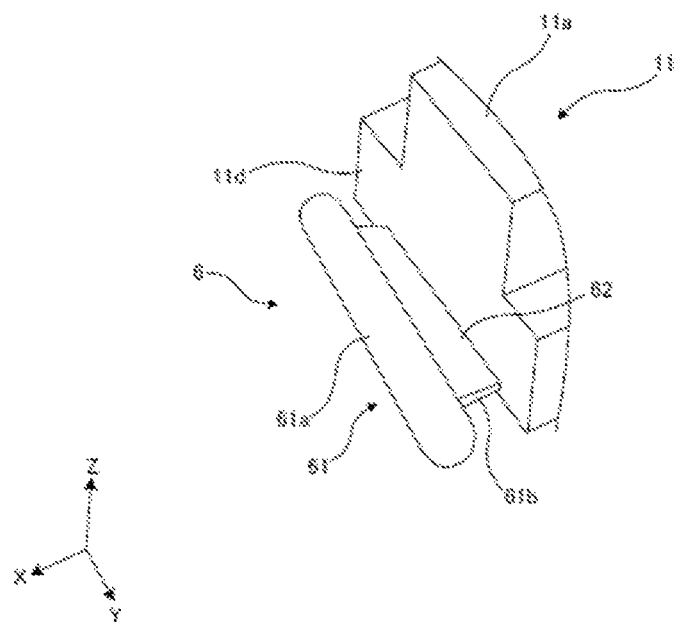
FIG. 7 is a perspective view, from another direction, of the case according to the embodiment.

Also, in the present embodiment, as illustrated in FIG. 7, a resin reservoir 6 corresponding to the exit of the resin is formed on the side face 11d positioned on one end of the case 11. The resin channel portion 5 and the resin reservoir 6 are provided at symmetric positions in the X direction on either side of the case 11. The resin reservoir 6 is configured to include a runner 61 (other runner) and a single gate 62 (second gate) joining the runner 61 and the case 11.

The single gate 62 (second gate) is formed centered at the lower edge of the side face 11d having a flat YZ plane. According to this configuration, the single gate 62 is disposed centered at the lower edge of the side face 11c on the short side of the case 11. Also, the gate 62 is provided at a symmetric position with respect to the gate 52 in the X direction, with the case 11 in between. Consequently, unwanted resin can flow out uniformly and without bias, weld portions can be reduced, and a case with uniform characteristics can be produced. Also, the gate 62 is formed on a flat surface (side face 11d). For this reason, the unwanted portions of the molded product can be removed easily.

The runner 61 is configured to include a portion that allows the escape of air contained in the resin at the beginning of injection. Specifically, the runner 61 includes a first runner 61a and a second runner 61b. The first runner 61a has a cylindrical shape extending to either side in the Y direction at a location facing the side face 11d of the case 11. The first runner 61a has a length corresponding to the width of the case 11 in the Y direction.

The second runner 61b extends in a film shape in the negative X direction from the side face of the first runner 61a toward the side face 11d of the case 11. The second runner 61b is long in the width direction (Y direction) of the case 11, and has thickness in the Z direction. Also, the second runner 61b has a tapered shape inclined such that the thickness decreases in the negative X direction (toward the gate 62 described later). The angle of inclination is preferably 10 degrees or greater and 30 degrees or less.

The gate 62 is a passage that connects the runner 61 (second runner 61b) and the mold, and forms an exit out of the mold for the resin. The gate 62 has a flat shape having a width (second width) that is long in the width direction (Y direction) of the case 11. The thickness (length in the Z direction) of the gate 62 is preferably 0.5 mm or greater and 2.5 mm or less. The thickness (length in the Z direction) of the gate 62 is preferably $\frac{1}{100}$th or greater and $\frac{1}{10}$th or less than the width (length in the Y direction) of the gate 62.

The gate 62 and the runner 61 described above form a resin discharge passage for discharging the air-containing resin from the beginning of injection to the outside of the case 11. With the gate 62 and the runner 61, even if air is drawn inside the case 11, an excellent molded product can be obtained with the air removed from the finished product.

Also, similarly to the entrance side, the thickness (length in the Z direction) of the gate 62 is small compared to the length (length in the Y direction), and moreover, the base end side of the second runner 61b is thick compared to the 62 side. Consequently, the rigidity on the base end side is increased. On the other hand, since the gate 62 is thin compared to the base end side of the second runner 61b, the rigidity in the Z direction is decreased. As a result, by applying a force in the Z direction when removing the resin channel portion 6, the gate 62 can be cut easily at the starting point.

Additionally, the second runner 61b on the exit side is preferably shorter than the second runner 51b on the entrance side. This is because the second runner 61b is primarily an unwanted portion as a part of the resin channel portion 6, and a shorter second runner 61b makes it more economical to reduce the resin used.

As described above, according to the present embodiment, by adopting a film-shaped gate for the injection-molded case 11, it is possible to supply a sufficient amount of resin even in a short time to obtain an excellent molded product.

Also, in the above embodiment, the number and layout of circuit boards is not limited to the above configuration and may be changed appropriately.

Also, in the above embodiment, the case 11 is configured to be formed into a box shape with an open bottom so as to cover the top of the base plate 10 and the plurality of semiconductor elements, but the case 11 is not limited to this configuration. The case 11 may also be configured as a frame shape open on the top and bottom. In this case, the configuration may also include a case lid disposed to cover the opening in the top of the case 11.

Also, the above embodiment is configured such that the case 11 is disposed on the top face of the base plate 10, but the configuration is not limited thereto. The case 11 may also be configured to be disposed on the top face of the multilayer substrates 2 rather than the base plate 10.

Also, the above embodiment takes a configuration in which the multilayer substrate 2 and the semiconductor elements are formed in a rectangular or square shape in a plan view, but the embodiment is not limited to this configuration. The multilayer substrates 2 and the semiconductor elements may also be formed in a polygonal shape other than the above.

In addition, the present embodiment and modifications have been described, but the above embodiment and the modifications may also be combined in full or in part and treated as another embodiment.

Also, the present embodiment is not limited to the above embodiment and modifications, and various modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

A semiconductor module case according to the above embodiment houses semiconductor elements and is formed by injection molding into a box shape open on the bottom, the case having a rectangular shape in a plan view with external terminals disposed on a top face or a side face of the case, the external terminals being electrically connected to the semiconductor elements on the inside of the case and penetrating through the inside to the outside of the case, the case being provided with a single first gate that is an entrance for a resin in a side face corresponding to a short side of the rectangular shape, wherein the first gate has a flat shape that is long in a width direction of the case.

Also, in the semiconductor module case according to the above embodiment, main terminals are disposed on one end of the rectangular shape, control terminals are disposed on another end, and the first gate is disposed on the side face on the other end.

Also, in the semiconductor module case according to the above embodiment, a plurality of grooves are formed along the longitudinal direction in the side face corresponding to the long side of the rectangular shape.

Also, in the semiconductor module case according to the above embodiment, the thickness of the first gate is 1/100th or greater and 1/10th or less than the width of the first gate.

Also, in the semiconductor module case according to the above embodiment, the resin is formed by a polyamide resin with an added filler.

Also, in the semiconductor module case according to the above embodiment, the first gate is provided at a lower edge of the case.

Also, in the semiconductor module case according to the above embodiment, a protruding part that projects downward is provided at the lower edge of the case, and the first gate is formed above the protruding part.

Also, the semiconductor module case according to the above embodiment is further provided with a single second gate that is an exit for the resin in a side face positioned on the one end, wherein the second gate has a flat shape that is long in a width direction of the case.

Also, in the semiconductor module case according to the above embodiment, the second gate is provided at a symmetric position with respect to the first gate.

Also, a method for producing a semiconductor module case according to the above embodiment includes filling a mold with a resin through the first gate, and removing a resin channel portion connected to the case, wherein the resin channel portion includes a runner that forms a channel for the resin connected to the first gate, and the runner has a film shape that is long in the width direction of the case, and is inclined such that the thickness decreases toward the first gate.

Also, in the method for producing a semiconductor module case according to the above embodiment, the angle of inclination of the runner is 10 degrees or greater and 30 degrees or less.

Also, in the method for producing a semiconductor module case according to the above embodiment, a single second gate that is an exit for the resin is provided in a side face positioned on the one end, the second gate has a flat shape that is long in a width direction of the case, the resin channel portion includes another runner that forms a channel for the resin connected to the second gate, and the other runner has a film shape that is long in the width direction of the case, is inclined such that the thickness decreases toward the second gate, and is shorter than the runner.

INDUSTRIAL APPLICABILITY

As described above, the present invention has the effect of supplying a sufficient amount of resin into a mold even in a short time to obtain an excellent molded product, and is particularly useful in a semiconductor module case and a method for producing a semiconductor module case.

This application is based on Japanese Patent Application No. 2020-111131 filed on Jun. 29, 2020, the content of which is hereby incorporated in entirety.

What is claimed is:

1. A semiconductor module case formed by injection molding into a box shape, the semiconductor module case being capable of housing a semiconductor element therein, the semiconductor module case comprising:

an external terminal disposed on a top face or a side face of the semiconductor module case, the external terminal penetrating through the semiconductor module case from an inside to an outside thereof and being electrically connectable to the semiconductor element inside of the semiconductor module case; and a first short side and a second short side;

a first long side and a second long side that are respectively longer than respective ones of the first and second short sides; and a single first gate for injecting a resin into the semiconductor module case, wherein the semiconductor module case has a rectangular shape in a plan view of the semiconductor module case, the semiconductor module case being opened at a bottom thereof, and the first gate is disposed at a side face of the first short side and has a flat surface area having a first width that extends along the first short side in a width direction of the semiconductor module case.

2. The semiconductor module case according to claim 1, wherein
the external terminal is provided in plurality and includes a main terminal and a control terminal, the main terminal being disposed closer to the second short side than to the first short side of the semiconductor module case, and the control terminal being disposed closer to the first short side than to the second short side of the semiconductor module case.

3. The semiconductor module case according to claim 1, wherein a side face of the first long side of the semiconductor module case has a plurality of grooves that are arranged in a longitudinal direction of the first long side.

4. The semiconductor module case according to claim 1, wherein the first gate has the first width in the width direction and a thickness in a thickness direction orthogonal to the width direction and parallel to the side face of the first short side of the semiconductor module case, the thickness being in a range of 1/100th to 1/10th the first width of the first gate.

5. The semiconductor module case according to claim 1, wherein the resin is a polyamide resin with an added filler.

6. The semiconductor module case according to claim 1, wherein the first gate is provided at a lower edge of the semiconductor module case.

7. The semiconductor module case according to claim 6, wherein
the lower edge of the semiconductor module case has a protruding part that projects downward, and
the first gate is formed above the protruding part.

8. The semiconductor module case according to claim 1, further comprising:
a single second gate for the resin to exit from the semiconductor module case, the second gate being disposed at a side face of the second short side and having a flat surface area having a second width that extends along the second short side in the width direction of the semiconductor module case.

9. The semiconductor module case according to claim 8, wherein the first gate and the second gate are disposed symmetrically with respect to a center of the semiconductor module case in the plan view of the semiconductor module case.

10. A method for producing the semiconductor module case according to claim 1, comprising:

filling a mold with the resin from an injection molding machine through the first gate; and removing a resin channel portion connected to the semiconductor module case, wherein the resin channel portion includes a first runner connected to the first gate, which forms a channel for the resin, and the first runner has a flat surface area having a width that extends in the width direction of the semiconductor module case, and has, in a thickness direction orthogonal to the flat surface, a thickness that decreases from the injection molding machine toward the first gate.

11. The method for producing a semiconductor module case according to claim 10, wherein an angle of inclination of the flat surface of the runner is in a range of 10 degrees to 30 degrees.

12. The method for producing a semiconductor module case according to claim 10, wherein the semiconductor module case includes a single second gate for the resin to exit from the semiconductor module case, the second gate being provided at a side face of the second short side of the semiconductor module case, the second gate has a flat surface area having a second width that extends in the width direction of the semiconductor module case, the resin channel portion includes a second runner connected to the second gate, which forms a channel for the resin, and the second runner has a flat surface area having a width that extends in the width direction of the semiconductor module case, has a thickness in the thickness direction that decreases from the injection molding machine toward the second gate, and has, in a length direction orthogonal to the width direction, a length that is shorter than a length of the first runner in the length direction.

* * * * *